US008810280B2

(12) United States Patent
Pyapali et al.

(10) Patent No.: US 8,810,280 B2
(45) Date of Patent: Aug. 19, 2014

(54) LOW LEAKAGE SPARE GATES FOR INTEGRATED CIRCUITS

(75) Inventors: Rambabu Pyapali, Cupertino, CA (US); Yongjun Zhang, Sunnyvale, CA (US); Yongning Sheng, San Jose, CA (US)

(73) Assignee: Oracle International Corporation, Redwood Shores, CA (US)

( * ) Notice: Subject to any disclaimer, the term of this patent is extended or adjusted under 35 U.S.C. 154(b) by 54 days.

(21) Appl. No.: 13/267,142

(22) Filed: Oct. 6, 2011

(65) Prior Publication Data
US 2013/0088261 A1 Apr. 11, 2013

(51) Int. Cl.
*H03K 19/00* (2006.01)
(52) U.S. Cl.
USPC ............................................. 326/102; 326/41
(58) Field of Classification Search
USPC .................................................. 326/41, 102
See application file for complete search history.

(56) References Cited

U.S. PATENT DOCUMENTS

| 5,247,456 | A | * | 9/1993 | Ohe et al. ...................... 716/102 |
| 5,416,740 | A | | 5/1995 | Fujita et al. |
| 6,255,845 | B1 | | 7/2001 | Wong et al. |
| 6,404,226 | B1 | | 6/2002 | Schadt |
| 6,822,477 | B1 | | 11/2004 | Bingert et al. |
| 7,034,384 | B2 | | 4/2006 | Tsai |
| 7,644,386 | B1 | | 1/2010 | Chan et al. |
| 7,676,776 | B2 | | 3/2010 | Tsapepas et al. |
| 7,965,107 | B2 | | 6/2011 | Ciccarelli et al. |
| 8,304,260 | B2 | * | 11/2012 | Hirayu ............................ 438/6 |
| 2001/0016934 | A1 | * | 8/2001 | Kumagai ........................ 716/1 |
| 2005/0235240 | A1 | | 10/2005 | Tien |
| 2007/0157151 | A1 | | 7/2007 | Kim |
| 2010/0231256 | A1 | * | 9/2010 | Jain et al. ........................ 326/41 |
| 2011/0169528 | A1 | * | 7/2011 | Verma et al. .................... 326/95 |

* cited by examiner

*Primary Examiner* — Jason M Crawford
(74) *Attorney, Agent, or Firm* — Kraguljac Law Group, LLC

(57) ABSTRACT

Devices, systems, methods, and other embodiments associated with spare gates are described. In one embodiment, a spare gate in an integrated circuit has a disconnected discharge path to minimize or eliminate current leakage.

19 Claims, 4 Drawing Sheets

Original nand2 layout:
Note circled metal of
output node.

Spare nand2 layout:
Note circled metal of
output node is cut open.

US 8,810,280 B2

LOW LEAKAGE SPARE GATES FOR INTEGRATED CIRCUITS

BACKGROUND

The design of high speed microprocessors must be logically well-defined. The increased design complexity of leading-edge microprocessors and systems on a chip (SoC) is driving the industry to find better ways to implement the physical and logical designs of chips.

Using a computer layout generated as a blueprint, a number of basic CMOS transistor layers, contacts, and metal layers defining the elements and interconnections of the integrated circuit (IC) are created in silicon. This involves a combination of semiconductor processes namely depositing, masking, and etching. When combined, the layers form the IC with functions. Depending on the complexity of the chip, each circuit may involve multiple basic layers, multiple contacts, and multiple metal layers. This layer-patterns-release procedure is widely known as tape-out.

Following tape-out, for various reasons including design changes, modifications are subsequently required to delete logic elements as well as add logic elements and interconnections from the original design. When this occurs, an engineering change order (ECO) is generated to specifically document the desired changes. Bug fixes are also common. Therefore, integrated circuit designers put spare cells or spare gates in CMOS logic in pre-determined areas of the integrated circuit layouts. The spare gates are formed in arrays and can be used as spare logic for physical fixes requiring only higher level changes (e.g., metal only change) in the several layers of the chip. Having enough gate arrays in a design may determine if a bug fix is possible in a certain derivation of the design.

However, adding spare gates to a design has an associated cost. The spare gates take up space on the chip and consume power. Although spare gates do not function in the actual logic, the spare gates have their gates tied to high or low voltage. Thus current leakage occurs through the gates. As the number of spare gates increase on a chip, there may be significant power leakage.

BRIEF DESCRIPTION OF THE DRAWINGS

The accompanying drawings, which are incorporated in and constitute a part of the specification, illustrate various systems, methods, and other embodiments of the disclosure. It will be appreciated that the illustrated element boundaries (e.g., boxes, groups of boxes, or other shapes) in the figures represent one embodiment of the boundaries. One of ordinary skill in the art will appreciate that in some embodiments one element may be designed as multiple elements or that multiple elements may be designed as one element. In some embodiments, an element shown as an internal component of another element may be implemented as an external component and vice versa. Furthermore, elements may not be drawn to scale.

DETAILED DESCRIPTION

Devices, systems and methods are described herein that provide a spare gate configuration for an integrated circuit. In one embodiment, spare gates are configured with disconnected current leakage paths by keeping selected transistor drains floating so that little or no current is leaked. Thus in one embodiment, a device provides a very low leakage spare gate methodology for advanced microprocessors in advanced process nodes.

As an integrated circuit design becomes more complex, the design is more prone to last minute changes and bug fixes. Spare gates are implemented and used in the design to accommodate changes like functional modifications or to fix timing bugs. The step to perform revisions in a design is called an Engineering change order (ECO).

As described herein, in one embodiment, an integrated circuit design includes spare gates that are distributed in selected areas in the chip layout. Spare gates typically have outputs that are not connected to other gates. When spare gates are to be included into a functional circuit, their outputs in the metal layer of the chip are connected to desired paths. A chip layout may include many different types of spare gates and universal gates so that any functionality can be achieved in a design revision.

Figure 1:
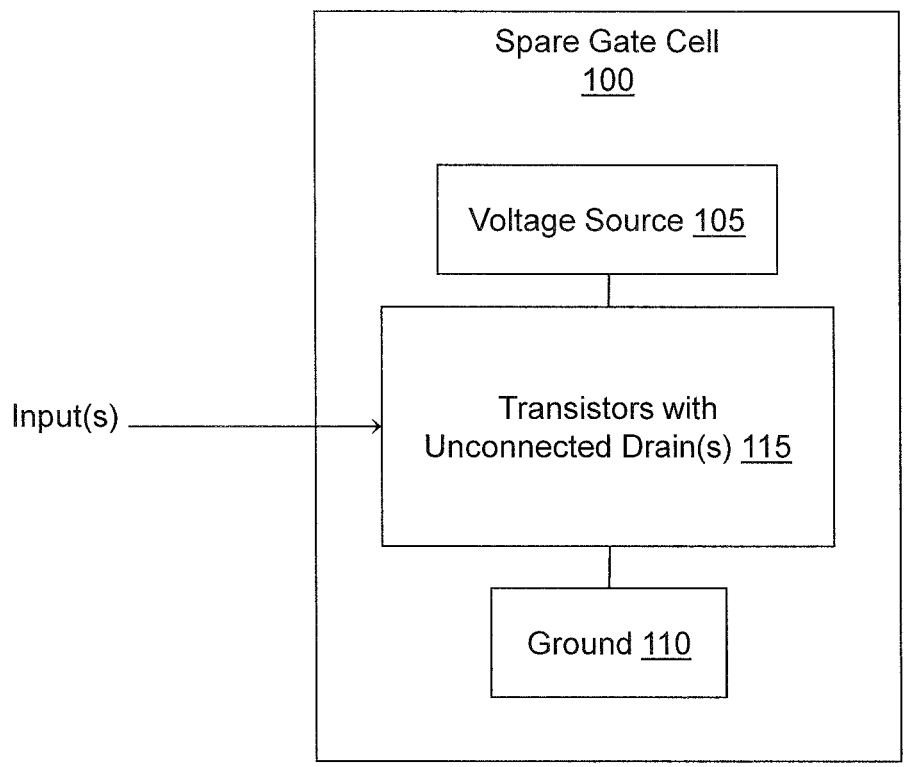
FIG. 1 illustrates one embodiment of a spare gate cell.

With reference to FIG. 1, one embodiment of a spare gate cell 100 is shown in block form. As described previously, spare gates are implemented in integrated circuits and used to fix errors or to change a function in the circuit. Suppose spare gate cell 100 generically represents one gate but in other embodiments many gates can be implemented in a cell. Different types of gates can be formed including inverter gates, NAND gates, NOR gates, XOR gates, multiplexer gates, flip-flop gates, decoupling capacitor (decap) gates, buffers, nand2, nand3, nor2, nor3, aoi22, oai22 of different drive strengths, and so on. The numeric reference after the gate name indicates the number of inputs to the gate (e.g., NOR2 is a NOR gate with two inputs, AIO22 is an AND-OR-Inverter gate with two inputs).

The spare gate cell 100 includes a voltage source 105 (e.g., VDD) and a ground 110 connected to one or more of transistors 115. The transistors 115 are interconnected and configured to implement a particular type of gate function (e.g., NAND, NOR, etc.) and have one or more inputs. Other circuit components may also be included in the spare gate cell 100 depending on the gate function. A transistor is composed of a semiconductor material with at least three terminals for connection to an external circuit. The terminals are referred to as gate, source, and drain in a field-effect transistor (FET) or base, collector, and emitter in a bipolar transistor.

To minimize or eliminate current leakage from the spare gate cell 100, one or more drains/terminals from the transistors 115 is unconnected to other nodes or junctions. In other words, a drain/terminal that is normally connected to other junctions in a functional gate is instead left floating. Which drains/terminals are selected and unconnected depends on the gate function and configuration of the components. In general, terminals are disconnected to cause a current discharge path from the voltage source 105 to the ground 110 to be disconnected (e.g., no discharge path exists). As such, current from the voltage source 105 cannot leak through the transistors 115 to ground, which results in power savings. Of course, once the spare gate is used in a functioning circuit, the terminals are reconnected as usual. Otherwise, the gate would not operate properly.

Figure 2A:
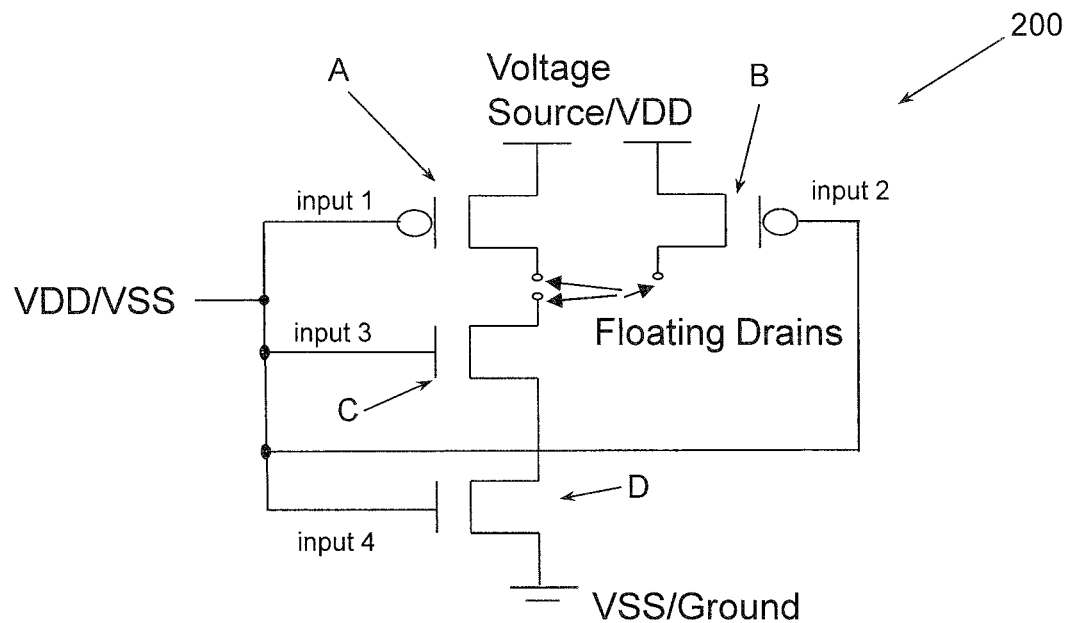
FIG. 2A illustrates one embodiment of a spare NAND gate.

With reference to FIG. 2A, one embodiment of the spare gate cell 100 of FIG. 1 is shown with a NAND spare gate 200. The NAND gate 200 includes four inputs (e.g., input 1, 2, 3, and 4) connected to four transistors (e.g., PMOS transistor A, PMOS transistor B, NMOS transistor C, and NMOS transistor D, respectively) that form the NAND function. The transistors are connected between a voltage source/VDD and VSS/ground. The inputs to the transistors are connected to either VDD or VSS and the sources are connected to VDD for the PMOS transistors A, B and VSS for the NMOS transistors C, D. In one embodiment, the drains/terminals of three transistors A, B, and C are disconnected from each other and are left floating (labeled "floating drains"). In other words, the metal contacts from the drain terminals are not connected to another component or circuit. As such, a current path from the voltage source to the ground is disconnected and current cannot leak out to ground.

Figure 2B:
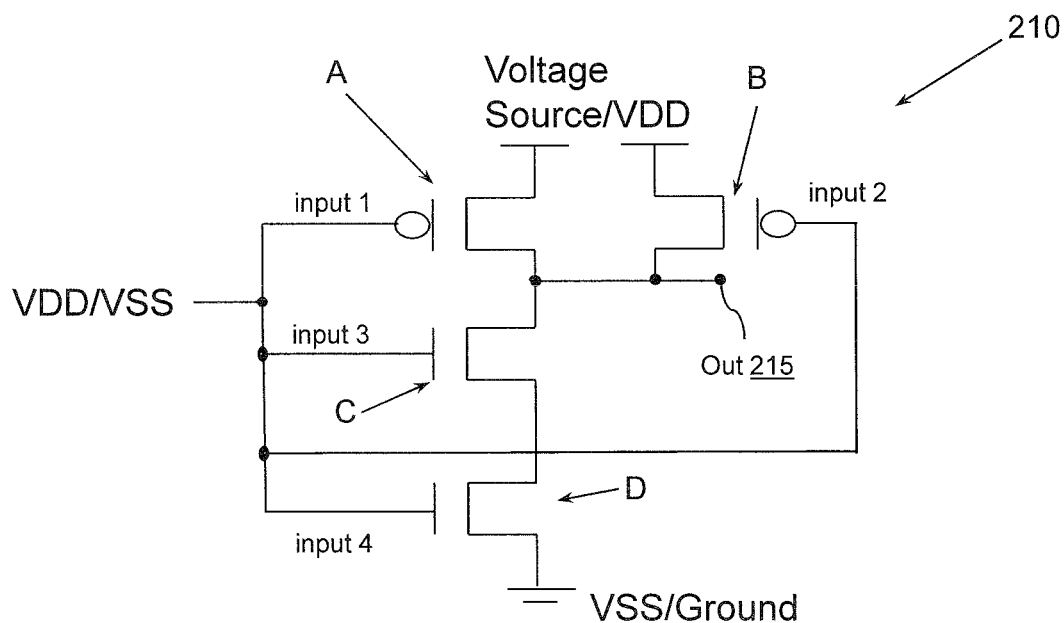
FIG. 2B illustrates one embodiment of the spare NAND gate of FIG. 2A with drains connected.

Contrast the spare NAND gate 200 to a normal NAND gate where the drains of the NMOS gate C and the PMOS gates A and B are connected together to form an output node via metal 1 (e.g., metal layer 1 on a substrate). One example is shown in FIG. 2B as NAND gate 210, which is NAND gate 200 with the floating drains connected to form output node 215. The drains are connected before the spare gate 200 is used in a circuit. Output node 215 is the out path for the gate 210. Since the drains are connected in a normal functioning NAND gate, a current discharge path exists from the transistors to ground and would leak current even when the gate is not in use (e.g., maintained as a spare). For the spare gates 200 in the present configuration, these metal 1 wires are disconnected. The spare gates 200 are electrically defunct with their drains disconnected. However, the spare gates will not leak any power through the disconnected paths.

Figure 3A:
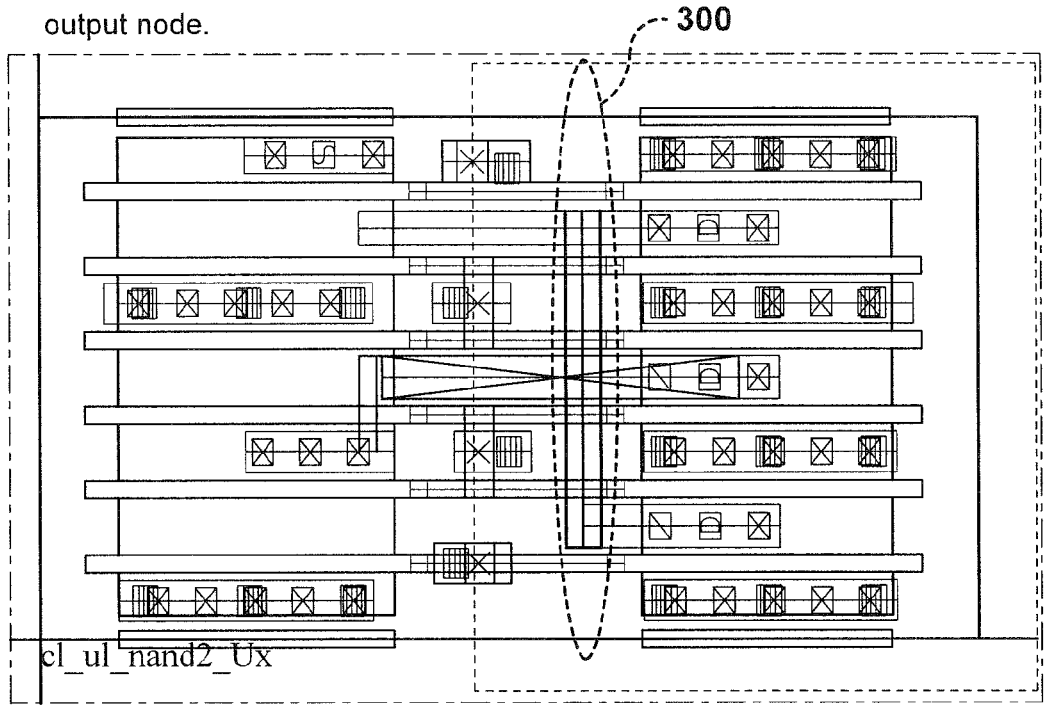
FIG. 3A illustrates one embodiment a NAND2 gate metal layout in a diagram shown with the metal of the output node connected.
Figure 3B:
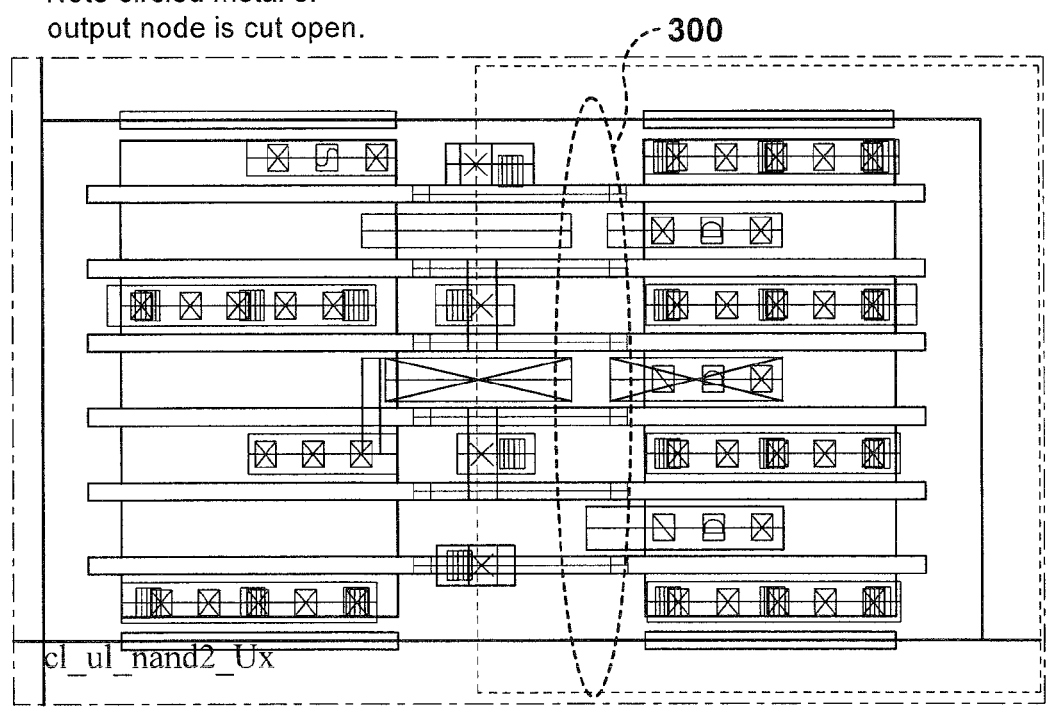
FIG. 3B illustrates the NAND2 gate metal layout of FIG. 3A with the metal of the output node removed.

FIGS. 3A and 3B shows example layout diagrams of a spare nand2 gate. FIG. 3A shows the metal layout with the drains and output node connected as in a usual nand2 gate. The output node is circled with reference circle 300 and the metal paths of the output node are highlighted as a rectangular area for visibility. In FIG. 3B, the metal paths of the output node are shown cut open (removed/disconnected). As seen in the same circled area 300, the rectangular lines of the metal output have been removed. This reflects the floating drains that are disconnected at the output in FIG. 2.

Since leakage is eliminated or at least minimized with the present gate configuration, spare gates can be implemented with low voltage threshold (LVT) transistors. LVT transistors leak more current than standard voltage threshold (SVT) transistors (e.g., 3-5 times more leakage) and thus are not recommended for use as spare gates. However with the current leakage path eliminated from the spare gates, using LVT transistors does not result in significant leakage. Thus the spare gates can be implemented with LVT transistors to benefit from their speed for timing critical paths.

Figure 4:
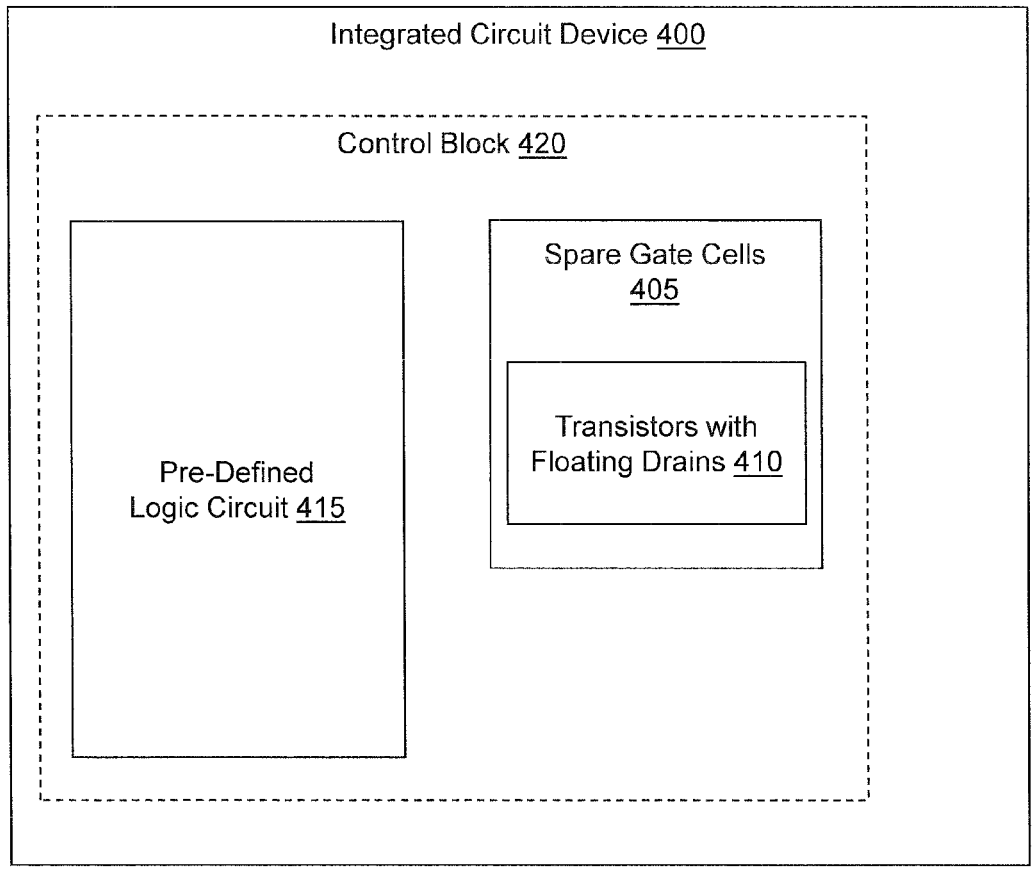
FIG. 4 illustrates an embodiment of an integrated circuit device with spare gate cells.

With reference to FIG. 4, one embodiment of an integrated circuit device 400 is shown that includes spare gate cells 405. The spare gate cells 405 are configured with one or more transistors 410 with floating drains/terminals. The floating drains/terminals, as described above, are disconnected so that no current discharge path exists in the gate. Therefore, the spare gates do not have significant current leakage.

The integrated circuit device 400 may be a microprocessor chip, an advanced process node, or other circuit that may benefit from having spare gates in its design. In one embodiment, the device 400 is a microprocessor with a pre-defined logic circuit 415. The pre-defined logic circuit 415 can be any implemented circuit built with gates. In one embodiment, the pre-defined logic circuit is part of a control block 420 in the processor. The spare gate cells 405 are also formed on the chip in a spare gate region and/or may be interspersed with the functioning gates of the circuit 415 in the control blocks. In one embodiment, the spare gates 405 are implemented as gate arrays.

Modern day processors have approximately 6 billion gates and can include 3-5% of the gates as spare gates. The amount of spare gates is dependent upon their power consumption and consumed chip area. However with the present configuration of spare gates, power consumption is much less of an issue since power leakage is minimized or eliminated. As previously described, the spare gate cells 405 included transistors 410 with floating drains that disconnect a path from a voltage input to ground in the spare gate cell to eliminate a current discharge path for the gate.

In one embodiment, a set of standard cells are usually chosen to be included in a spare gate macro when designing the integrated circuit 400. The number of different types of spare gates is, for example, around 13-14 of the most commonly used gates in the particular circuit. The spare gates can include buffers, invertors, nand2, nand3, nor2, nor3, aoi22, oai22 of different drive strengths. Of course, other numbers of spare gates can be selected. As previously described, selected transistor drains/terminals from each gate is disconnected so that no current discharge path exists in the gate. These spare gates are electrically defunct with their drains disconnected but they do not leak any power through their respective gate.

To fix a bug or when a change is desired in the pre-defined logic circuit 415, some of the spare gates 405 are used. A change may include fixing a bug, replacing non-functioning gates, changing or adding a function, and so on. For example, the circuit 415 may need a new NAND gate, or an addition algorithm may need to be modified to run faster. Spare gates are used to modify the pre-defined logic circuit 415 accordingly. The process involves an engineering change order (ECO) where an engineer provides specific instructions for changing gates with spare gates and connecting the appropriate input and output paths from the spare gates to the appropriate paths in the logic circuit 415. In one embodiment, the normal standard cells can be swapped in and the connections can be made according to a change netlist. Only the wire paths in the chip/device 400 are changed, which are in the metal layers. The base layers of the chip are not changed. Thus a metal-only tape-out is performed on the chip, which is much more efficient and less costly than an entire re-fabrication of the chip.

In one embodiment, an electronic device is implemented with the integrated circuit device 400. The electronic device may be a computing device, a server, a smart phone, a cellular phone, a portable computer, a hand-held device, a gaming system, and so on.

In another embodiment, described methods and/or their equivalents may be implemented with computer executable instructions. Thus, in one embodiment, a non-transitory computer-readable medium is configured with stored computer executable instructions that when executed by a machine (e.g., processor, computer, and so on) cause the machine (and/or associated components) to perform the method. In one embodiment, the method including building an integrated circuit with the described spare gates and disconnecting (leaving unconnected) selected transistor drains/terminals in the spare gates.

DEFINITIONS

The following includes definitions of selected terms employed herein. The definitions include various examples and/or forms of components that fall within the scope of a term and that may be used for implementation. The examples are not intended to be limiting. Both singular and plural forms of terms may be within the definitions.

References to "one embodiment", "an embodiment", "one example", "an example", and so on, indicate that the embodiment(s) or example(s) so described may include a particular feature, structure, characteristic, property, element, or limitation, but that not every embodiment or example necessarily includes that particular feature, structure, characteristic, property, element or limitation. Furthermore, repeated use of the phrase "in one embodiment" does not necessarily refer to the same embodiment, though it may.

"Computer-readable medium", as used herein, refers to a non-transitory medium that stores instructions and/or data. A computer-readable medium may take forms, including, but not limited to, non-volatile media, and volatile media. Non-volatile media may include, for example, optical disks, magnetic disks, and so on. Volatile media may include, for example, semiconductor memories, dynamic memory, and so on. Common forms of a computer-readable medium may include, but are not limited to, a floppy disk, a flexible disk, a hard disk, a magnetic tape, other magnetic medium, an ASIC, a CD, other optical medium, a RAM, a ROM, a memory chip or card, a memory stick, and other media from which a computer, a processor or other electronic device can read.

"Logic", as used herein, includes but is not limited to hardware, firmware, a non-transitory computer readable medium that stores instructions, instructions in execution on a machine, and/or combinations of each to perform a function (s) or an action(s), and/or to cause a function or action from another logic, method, and/or system. Logic may include a microprocessor, a discrete logic (e.g., ASIC), an analog circuit, a digital circuit, a programmable logic device, a memory device containing instructions, and so on. Logic may include one or more gates, combinations of gates, or other circuit components. Where multiple logics are described, it may be possible to incorporate the multiple logics into one physical logic. Similarly, where a single logic is described, it may be possible to distribute that single logic between multiple physical logics.

While example systems, methods, and so on have been illustrated by describing examples, and while the examples have been described in considerable detail, it is not the intention of the applicants to restrict or in any way limit the scope of the appended claims to such detail. It is, of course, not possible to describe every conceivable combination of components or methodologies for purposes of describing the systems, methods, and so on described herein. Therefore, the disclosure is not limited to the specific details, the representative apparatus, and illustrative examples shown and described. Thus, this application is intended to embrace alterations, modifications, and variations that fall within the scope of the appended claims.

To the extent that the term "includes" or "including" is employed in the detailed description or the claims, it is intended to be inclusive in a manner similar to the term "comprising" as that term is interpreted when employed as a transitional word in a claim.

To the extent that the term "or" is used in the detailed description or claims (e.g., A or B) it is intended to mean "A or B or both". When the applicants intend to indicate "only A or B but not both" then the phrase "only A or B but not both" will be used. Thus, use of the term "or" herein is the inclusive, and not the exclusive use. See, Bryan A. Garner, A Dictionary of Modern Legal Usage 624 (2d. Ed. 1995).

To the extent that the phrase "one or more of, A, B, and C" is used herein, (e.g., a data store configured to store one or more of, A, B, and C) it is intended to convey the set of possibilities A, B, C, AB, AC, BC, and/or ABC (e.g., the data store may store only A, only B, only C, A&B, A&C, B&C, and/or A&B&C). It is not intended to require one of A, one of B, and one of C. When the applicants intend to indicate "at least one of A, at least one of B, and at least one of C", then the phrasing "at least one of A, at least one of B, and at least one of C" will be used.

What is claimed is:

1. A spare gate cell, comprising:
a voltage source connection;
a ground connection;
a plurality of transistors interconnected between the voltage source connection and the ground connection, wherein the plurality of transistors are low voltage threshold (LVT) transistors that have greater current leakage than standard voltage threshold (SVT) transistors, and wherein the LVT transistors are implemented for timing critical paths in an integrated circuit; and
wherein a plurality of drains from the plurality of low voltage threshold (LVT) transistors are unconnected wherein a discharge path from the voltage source connection to the ground connection is disconnected;
wherein the spare gate cell is formed on an integrated circuit chip that includes a pre-defined logic circuit formed on the integrated circuit chip, and wherein the plurality of low voltage threshold (LVT) transistors being configured to modify functionality of the pre-defined logic circuit.

2. The spare gate cell of claim 1, wherein the plurality of transistors define spare gates configured to accommodate changes to the pre-defined logic by connecting selected input and output paths from the spare gates to selected paths in the pre-defined logic.

3. The spare gate cell of claim 1, wherein the plurality of transistors have one or more drains connected to each other and a plurality of floating drains.

4. The spare gate cell of claim 1, wherein an LVT transistor from the plurality of low voltage threshold (LVT) transistors has 3 to 5 times more leakage than a standard voltage threshold (SVT) transistor.

5. The spare gate cell of claim 1, wherein the plurality of transistors are connected to a plurality of inputs; and
wherein at least two transistors have floating drains that are unconnected.

6. The spare gate cell of claim 1, wherein the at least one drain that is unconnected includes a metal output that is not connected to another electrical component.

7. An integrated circuit device, comprising:
a pre-defined logic circuit formed on an integrated circuit chip;
a plurality of spare gate cells formed on the integrated circuit chip and configured to selectively modify a functionality of the pre-defined logic circuit; and
wherein the plurality of spare gate cells includes a plurality of transistors with floating drains that disconnect a path from a voltage input to ground in the spare gate cell;
wherein the plurality of transistors are low voltage threshold (LVT) transistors that have greater current leakage than standard voltage threshold (SVT) transistors, and wherein the LVT transistors are implemented for timing critical paths in the integrated circuit device.

8. The integrated circuit device of claim 7, wherein the plurality of spare gate cells include a plurality of transistors that have one or more drains connected to each other and a plurality of floating drains that have no discharge path to ground.

9. The integrated circuit device of claim 7, wherein the plurality of transistors are configured to accommodate changes to the pre-defined logic circuit by connecting selected input and output paths from the spare gates to selected paths in the pre-defined logic circuit including one or more of the timing critical paths.

10. The integrated circuit device of claim 7, wherein the plurality of transistors are connected to a plurality of inputs; and
wherein at least two transistors have floating drains.

11. The integrated circuit device of claim 7, wherein the plurality of spare gate cells include one or more of NAND gates, NOR gates, XOR gates, or inverter gates.

12. A microprocessor, comprising:
a control block;
a plurality of logic cells in the control block, where the plurality of logic cells are configured to implement at least one function; and
a spare gate in the control block, the spare gate comprising a plurality of transistors including a floating drain wherein a discharge path from the transistor to a ground is disconnected;
wherein the plurality of transistors are low voltage threshold (LVT) transistors that have greater current leakage than standard voltage threshold (SVT) transistors, and wherein the LVT transistors are configured for timing critical paths in the plurality of logic cells to implement the at least one function.

13. The microprocessor of claim 12, wherein the spare gate further includes:
a plurality of transistors configured to implement a gate function;
a connection to a voltage input and a connection to the ground;
wherein the discharge path is a path between the voltage input and the ground is disconnected by the floating drains of the low voltage threshold (LVT) transistors.

14. The microprocessor of claim 12, wherein the spare gate includes a plurality of transistors connected to a plurality of inputs; and
wherein at least two transistors have floating drains causing the spare gate to be electrically defunct.

15. The microprocessor of claim 12, wherein the low voltage threshold (LVT) transistors have disconnected drains, and wherein each LVT transistor has 3 to 5 times more leakage than a standard voltage threshold (SVT) transistor.

16. The microprocessor of claim 12, further comprising a plurality of spare gate cells wherein each of the spare gate cells includes an integrated circuit with a voltage input and a ground, wherein the integrated circuit has no discharge path between the voltage input and the ground.

17. The microprocessor of claim 12, wherein the floating drain of the at least one transistor includes a metal output that is not connected to another electrical component.

18. The microprocessor of claim 12, further comprising a plurality of spare gates in the control block, wherein the plurality of spare gates includes a plurality of transistors that each have a gate, a source, and a drain, wherein the drain is a floating drain and wherein the source is connected to VDD for a PMOS transistor and the source is connected to VSS for an NMOS transistor.

19. The microprocessor of claim 12, wherein the plurality of transistors are configured to accommodate changes to the plurality of logic cells in the control block by connecting selected input and output paths from the plurality of transistors in the spare gate to selected paths in the plurality of logic cells in the control block.

* * * * *